United States Patent
Bergmann et al.

(10) Patent No.: US 10,260,683 B2
(45) Date of Patent: Apr. 16, 2019

(54) SOLID-STATE LAMP WITH LED FILAMENTS HAVING DIFFERENT CCT'S

(71) Applicant: Cree, Inc., Durham, NC (US)

(72) Inventors: Michael John Bergmann, Raleigh, NC (US); John Adam Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/591,646

(22) Filed: May 10, 2017

(65) Prior Publication Data
US 2018/0328543 A1    Nov. 15, 2018

(51) Int. Cl.
| | |
|---|---|
| *F21K 9/232* | (2016.01) |
| *F21K 9/238* | (2016.01) |
| *F21V 29/83* | (2015.01) |
| *H05B 33/08* | (2006.01) |
| *H01L 25/075* | (2006.01) |
| *H01L 33/62* | (2010.01) |
| *H01L 33/56* | (2010.01) |
| *H01L 33/50* | (2010.01) |
| *H01L 33/60* | (2010.01) |
| *F21Y 115/10* | (2016.01) |
| *F21Y 113/13* | (2016.01) |

(52) U.S. Cl.
CPC ............. *F21K 9/232* (2016.08); *F21K 9/238* (2016.08); *F21V 29/83* (2015.01); *H01L 25/0753* (2013.01); *H01L 33/502* (2013.01); *H01L 33/56* (2013.01); *H01L 33/60* (2013.01); *H01L 33/62* (2013.01); *H05B 33/0857* (2013.01); *F21Y 2113/13* (2016.08); *F21Y 2115/10* (2016.08)

(58) Field of Classification Search
CPC ............. F21K 9/23; F21K 9/232; F21K 9/238
See application file for complete search history.

(56) References Cited

U.S. PATENT DOCUMENTS

| | | |
|---|---|---|
| 3,581,162 A | 5/1971 | Wheatley et al. |
| 4,161,021 A | 7/1979 | George, Jr. et al. |
| 5,463,280 A | 10/1995 | Johnson et al. |

(Continued)

FOREIGN PATENT DOCUMENTS

| | | |
|---|---|---|
| EP | 1058221 A2 | 12/2000 |
| EP | 0890059 B1 | 6/2004 |

(Continued)

OTHER PUBLICATIONS

Chinese Patent Office; Chinese Office Action for Chinese Application No. 201280071001.4 dated Jun. 19, 2015, 13 Pages.

(Continued)

*Primary Examiner* — Robert J May
(74) *Attorney, Agent, or Firm* — Myers Bigel, P.A.

(57) ABSTRACT

A lamp includes an optically transmissive enclosure for emitting an emitted light and a base connected to the enclosure. At least one first LED filament and at least one second LED filament are located in the enclosure and are operable to emit light when energized through an electrical path from the base. The first LED filament emits light having a first correlated color temperature (CCT) and the second LED filament emits light having a second CCT that are combined to generate the emitted light. A controller operates to change the CCT of the emitted light when the lamp is dimmed.

21 Claims, 12 Drawing Sheets

(56) References Cited

U.S. PATENT DOCUMENTS

| | | |
|---|---|---|
| 5,559,681 A | 9/1996 | Duarte et al. |
| 5,561,346 A | 10/1996 | Byrne et al. |
| 5,585,783 A | 12/1996 | Hall et al. |
| 5,655,830 A | 8/1997 | Ruskouski et al. |
| 5,672,000 A | 9/1997 | Lin et al. |
| 5,688,042 A | 11/1997 | Madadi et al. |
| 5,806,965 A | 9/1998 | Deese et al. |
| 5,836,673 A | 11/1998 | Lo et al. |
| 5,890,794 A | 4/1999 | Abtahi et al. |
| 5,947,588 A | 9/1999 | Huang et al. |
| 5,949,347 A | 9/1999 | Wu et al. |
| 6,220,722 B1 | 4/2001 | Begemann |
| 6,227,679 B1 | 5/2001 | Zhang et al. |
| 6,234,648 B1 | 5/2001 | Brner et al. |
| 6,250,774 B1 | 6/2001 | Begemann et al. |
| 6,276,822 B1 | 8/2001 | Bedrosian et al. |
| 6,299,332 B1 | 10/2001 | Huang |
| 6,428,342 B1 | 8/2002 | Pan |
| 6,465,961 B1 | 10/2002 | Cao |
| 6,523,978 B1 | 2/2003 | Huang |
| 6,550,953 B1 | 4/2003 | Ichikawa et al. |
| 6,634,770 B2 | 10/2003 | Cao |
| 6,639,360 B2 | 10/2003 | Roberts et al. |
| 6,659,632 B2 | 12/2003 | Chen |
| 6,709,132 B2 | 3/2004 | Ishibashi |
| 6,744,194 B2 | 6/2004 | Fukasawa et al. |
| 6,803,607 B1 | 10/2004 | Chan et al. |
| 6,848,819 B1 | 2/2005 | Amdt et al. |
| 6,864,513 B2 | 3/2005 | Lin et al. |
| 6,888,173 B2 | 5/2005 | Ishii et al. |
| 6,948,829 B2 | 9/2005 | Verdes et al. |
| 6,982,518 B2 | 1/2006 | Chou et al. |
| 7,048,412 B2 | 5/2006 | Martin et al. |
| 7,063,996 B2 | 6/2006 | Ishii et al. |
| 7,080,924 B2 | 7/2006 | Tseng et al. |
| 7,080,926 B2 | 7/2006 | Chang |
| 7,086,756 B2 | 8/2006 | Maxik |
| 7,086,767 B2 | 8/2006 | Sidwell et al. |
| 7,141,442 B2 | 11/2006 | Sano |
| 7,144,135 B2 | 12/2006 | Martin et al. |
| 7,160,140 B1 | 1/2007 | Mrakovich et al. |
| 7,165,866 B2 | 1/2007 | Li |
| 7,172,314 B2 | 2/2007 | Currie et al. |
| 7,210,832 B2 | 5/2007 | Huang |
| 7,210,957 B2 | 5/2007 | Mrakovich et al. |
| 7,213,940 B1 | 5/2007 | Van De Ven et al. |
| 7,354,174 B1 | 4/2008 | Yan |
| 7,358,679 B2 * | 4/2008 | Lys .................... H05B 33/0815 315/291 |
| 7,396,142 B2 | 7/2008 | Laizure, Jr. et al. |
| 7,564,180 B2 | 7/2009 | Brandes |
| 7,588,351 B2 | 9/2009 | Meyer |
| 7,600,882 B1 | 10/2009 | Morejon et al. |
| 7,614,759 B2 | 11/2009 | Negley |
| 7,690,817 B2 | 4/2010 | Sanpei et al. |
| 7,726,836 B2 | 6/2010 | Chen |
| 7,824,065 B2 | 11/2010 | Maxik |
| 7,997,750 B2 | 8/2011 | Chiang |
| 8,008,845 B2 | 8/2011 | Van De Ven et al. |
| 8,018,139 B2 | 9/2011 | Chou |
| 8,021,025 B2 | 9/2011 | Lee |
| 8,253,316 B2 | 8/2012 | Sun et al. |
| 8,272,762 B2 | 9/2012 | Maxik et al. |
| 8,272,766 B2 | 9/2012 | Phipps et al. |
| 8,274,230 B2 * | 9/2012 | Chiu .................. H05B 33/0827 315/185 R |
| 8,274,241 B2 | 9/2012 | Guest et al. |
| 8,277,082 B2 | 10/2012 | Dassanayake et al. |
| 8,282,250 B1 | 10/2012 | Dassanayake et al. |
| 8,292,468 B2 | 10/2012 | Narendran et al. |
| 8,314,566 B2 | 11/2012 | Steele et al. |
| 8,322,896 B2 | 12/2012 | Falicoff et al. |
| 8,324,790 B1 | 12/2012 | Hu |
| 8,337,048 B2 | 12/2012 | Shen |
| 8,371,722 B2 | 2/2013 | Carroll |
| 8,398,261 B2 | 3/2013 | Nall et al. |
| 8,400,051 B2 | 3/2013 | Hakata et al. |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,445,927 B2 | 5/2013 | Joo et al. |
| 8,449,154 B2 | 5/2013 | Uemoto et al. |
| 8,502,468 B2 | 8/2013 | Li et al. |
| 8,598,809 B2 | 12/2013 | Negley et al. |
| 8,632,200 B2 | 1/2014 | Takeuchi et al. |
| 8,641,237 B2 | 2/2014 | Chuang |
| 8,653,723 B2 | 2/2014 | Cao et al. |
| 8,684,564 B2 | 4/2014 | Shen et al. |
| 8,696,168 B2 | 4/2014 | Li et al. |
| 8,698,388 B2 | 4/2014 | Cash |
| 8,729,589 B2 | 5/2014 | Hussell et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 8,789,988 B2 | 7/2014 | Goldwater |
| 8,950,892 B2 | 2/2015 | Cash |
| 8,955,996 B2 | 2/2015 | Ooya et al. |
| 8,967,827 B2 | 3/2015 | Urano et al. |
| 8,998,454 B2 | 4/2015 | Wang et al. |
| 9,052,067 B2 * | 6/2015 | van de Ven .............. F21V 3/02 |
| 9,097,396 B2 | 8/2015 | Rowlette, Jr. |
| 9,131,561 B2 | 9/2015 | Athalye |
| 9,131,571 B2 | 9/2015 | Zhang et al. |
| 9,192,016 B1 | 11/2015 | Athalye et al. |
| 9,277,605 B2 | 3/2016 | Ni |
| 9,303,823 B2 | 4/2016 | Hu et al. |
| 9,470,380 B2 | 10/2016 | Cornelissen et al. |
| 9,482,421 B2 | 11/2016 | Negley et al. |
| 9,488,767 B2 | 11/2016 | Nava et al. |
| 9,557,018 B2 * | 1/2017 | Steele ...................... F21V 7/00 |
| 9,730,289 B1 | 8/2017 | Hu et al. |
| 9,756,696 B1 | 9/2017 | Bradford |
| 9,967,943 B1 * | 5/2018 | Wang ................. H05B 33/0857 |
| 9,995,440 B2 * | 6/2018 | Edwards ................. F21K 9/64 |
| 2003/0063463 A1 | 4/2003 | Sloan et al. |
| 2004/0062041 A1 | 4/2004 | Cross et al. |
| 2004/0115984 A1 | 6/2004 | Rudy et al. |
| 2004/0201990 A1 | 10/2004 | Meyer |
| 2004/0223328 A1 | 11/2004 | Lee et al. |
| 2005/0047115 A1 | 3/2005 | Lin |
| 2005/0105291 A1 | 5/2005 | Wu |
| 2006/0137395 A1 | 6/2006 | Kamara et al. |
| 2007/0091598 A1 | 4/2007 | Chen |
| 2007/0263385 A1 | 11/2007 | Fan |
| 2007/0267976 A1 | 11/2007 | Bohler et al. |
| 2008/0151538 A1 | 6/2008 | Huang et al. |
| 2008/0232103 A1 | 9/2008 | Nall et al. |
| 2008/0253125 A1 | 10/2008 | Kang et al. |
| 2009/0001372 A1 | 1/2009 | Arik et al. |
| 2009/0129099 A1 | 5/2009 | Fan |
| 2009/0184618 A1 | 7/2009 | Hakata et al. |
| 2009/0284948 A1 | 11/2009 | Yamao et al. |
| 2009/0310351 A1 | 12/2009 | Lin |
| 2010/0109551 A1 | 5/2010 | Shen |
| 2010/0135024 A1 | 6/2010 | Gier et al. |
| 2010/0177522 A1 | 7/2010 | Lee |
| 2010/0181888 A1 | 7/2010 | Lu |
| 2010/0188844 A1 | 7/2010 | Dubois |
| 2010/0219734 A1 | 9/2010 | Lenk |
| 2010/0232168 A1 | 9/2010 | Horng et al. |
| 2010/0290235 A1 | 11/2010 | Wei et al. |
| 2011/0068702 A1 | 3/2011 | van de Ven et al. |
| 2011/0074270 A1 | 3/2011 | Van De Ven et al. |
| 2011/0074296 A1 | 3/2011 | Shen et al. |
| 2011/0176316 A1 | 7/2011 | Phipps et al. |
| 2011/0193479 A1 | 8/2011 | Nilssen et al. |
| 2011/0267812 A1 | 11/2011 | Van De Ven et al. |
| 2011/0273102 A1 | 11/2011 | van de Ven et al. |
| 2012/0007492 A1 | 1/2012 | Russell et al. |
| 2012/0040585 A1 | 2/2012 | Huang |
| 2012/0042512 A1 | 2/2012 | Bisberg |
| 2012/0069595 A1 | 3/2012 | Catalano |

(56) References Cited

U.S. PATENT DOCUMENTS

| | | |
|---|---|---|
| 2012/0126257 A1 | 5/2012 | Reiherzer et al. |
| 2012/0147624 A1 | 6/2012 | Li et al. |
| 2012/0155059 A1 | 6/2012 | Hoelen et al. |
| 2012/0161626 A1 | 6/2012 | van de Ven et al. |
| 2012/0169227 A1 | 7/2012 | Chidiac |
| 2012/0268938 A1 | 10/2012 | Peng |
| 2012/0275157 A1 | 11/2012 | Hsu |
| 2012/0306375 A1 | 12/2012 | van de Ven |
| 2012/0327647 A1 | 12/2012 | Husong |
| 2013/0003398 A1 | 1/2013 | Godbillon |
| 2013/0021811 A1 | 1/2013 | Goldwater |
| 2013/0026923 A1 | 1/2013 | Athalye et al. |
| 2013/0026925 A1 | 1/2013 | Ven et al. |
| 2013/0069535 A1 | 3/2013 | Athalye |
| 2013/0069547 A1 | 3/2013 | van de Ven et al. |
| 2013/0070452 A1 | 3/2013 | Urano et al. |
| 2013/0119872 A1 | 5/2013 | Chobot |
| 2013/0127353 A1 | 5/2013 | Athalye et al. |
| 2013/0162149 A1 | 6/2013 | van de Ven et al. |
| 2013/0162153 A1 | 6/2013 | van de Ven et al. |
| 2013/0169159 A1 | 7/2013 | Lys |
| 2013/0170245 A1 | 7/2013 | Hong et al. |
| 2013/0194797 A1 | 8/2013 | Jackson |
| 2013/0265796 A1 | 10/2013 | Kwisthout |
| 2013/0271989 A1 | 10/2013 | Hussell et al. |
| 2013/0293135 A1 | 11/2013 | Hu et al. |
| 2013/0328073 A1 | 12/2013 | Lowes et al. |
| 2014/0001959 A1 | 1/2014 | Motley et al. |
| 2014/0001963 A1 | 1/2014 | Chobot et al. |
| 2014/0167620 A1 | 6/2014 | Chobot |
| 2014/0167622 A1 | 6/2014 | Chobot et al. |
| 2014/0167623 A1 | 6/2014 | Chobot et al. |
| 2014/0167642 A1 | 6/2014 | Chobot |
| 2014/0167653 A1 | 6/2014 | Chobot |
| 2014/0197750 A1 | 7/2014 | Cash |
| 2014/0210364 A1 | 7/2014 | Cash et al. |
| 2014/0252967 A1 | 9/2014 | van de Ven et al. |
| 2014/0268790 A1 | 9/2014 | Chobot et al. |
| 2014/0313713 A1 | 10/2014 | Andrews |
| 2015/0085489 A1* | 3/2015 | Anderson .............. F21K 9/1355 362/249.06 |
| 2015/0102729 A1 | 4/2015 | Creasman et al. |
| 2015/0189708 A1 | 7/2015 | Cash |
| 2015/0312983 A1 | 10/2015 | Hu et al. |
| 2015/0330581 A1 | 11/2015 | van de Ven et al. |
| 2015/0342004 A1 | 11/2015 | Athalye et al. |
| 2015/0351187 A1 | 12/2015 | McBryde et al. |
| 2016/0372638 A1 | 12/2016 | Todorov et al. |
| 2017/0012177 A1 | 1/2017 | Trottier |

FOREIGN PATENT DOCUMENTS

| | | | |
|---|---|---|---|
| EP | 2108880 | A2 | 10/2009 |
| EP | 2447031 | A1 | 9/2014 |
| FR | 2926947 | A1 | 7/2009 |
| GB | 2345954 | A | 7/2000 |
| JP | H09265807 | A | 10/1997 |
| JP | 2000173304 | A | 6/2000 |
| JP | 2001118403 | A | 4/2001 |
| JP | 2007059930 | A | 3/2007 |
| JP | 2008288183 | A | 11/2008 |
| JP | 2009117346 | A | 5/2009 |
| JP | 3153766 | U | 9/2009 |
| JP | 2009277586 | A | 11/2009 |
| JP | 2013026053 | A | 2/2013 |
| KR | 100794523 | B1 | 1/2008 |
| TW | 201111692 | A | 4/2011 |
| WO | 0124583 | A1 | 4/2001 |
| WO | 0160119 | A2 | 8/2001 |
| WO | 2007130359 | A2 | 11/2007 |
| WO | 2008154172 | A1 | 12/2008 |
| WO | 2011097486 | A2 | 8/2011 |
| WO | 2011109093 | A1 | 9/2011 |
| WO | 2012011279 | A1 | 1/2012 |
| WO | 2012031533 | A1 | 3/2012 |

OTHER PUBLICATIONS

Cree, Inc., International Application No. PCT/US2012/070499, International Search Report and Written Opinion, dated Apr. 3, 2013.
3M, 3M Fluorinert Electronic Liquids, http://solutions.3m.com/wps/portal/3M/en_US/ElectronicsChemicals/Home/Products/ElectronicLiquids/, accessed Dec. 6, 2011.
U.S. Appl. No. 61/932,058, filed Jan. 27, 2014.
U.S. Appl. No. 15/294,992, Ex Parte Quayle Office Action, dated Apr. 6, 2017.
U.S. Appl. No. 14/794,884, Office Action, dated Jun. 23, 2016.
U.S. Appl. No. 14/451,623, Office Action, dated Aug. 4, 2015.
U.S. Appl. No. 14/451,623, Office Action, dated Mar. 14, 2016.
U.S. Appl. No. 13/866,587, Office Action, dated Jun. 8, 2015.
U.S. Appl. No. 13/866,587, Final Office Action, dated Nov. 5, 2015.
U.S. Appl. No. 13/866,587, Office Action, dated Jun. 14, 2016.
U.S. Appl. No. 13/866,587, Final Office Action, dated Nov. 30, 2016.
U.S. Appl. No. 13/866,587, Office Action, dated Mar. 2, 2017.
U.S. Appl. No. 13/866,587, Final Office Action, dated Jul. 31, 2017.
U.S. Appl. No. 13/340,928, Office Action, dated Oct. 7, 2013.
U.S. Appl. No. 13/340,928, Final Office Action, dated May 6, 2014.
U.S. Appl. No. 13/340,928, Office Action, dated Jan. 2, 2015.
U.S. Appl. No. 13/340,928, Final Office Action, dated May 22, 2015.
U.S. Appl. No. 13/340,928, Office Action, dated Sep. 22, 2015.
U.S. Appl. No. 13/340,928, Final Office Action, dated Mar. 3, 2016.
U.S. Appl. No. 13/866,587, Office Action, dated Nov. 30, 2017.
U.S. Appl. No. 13/866,587, Notice of Allowance, dated Jun. 1, 2018.

* cited by examiner

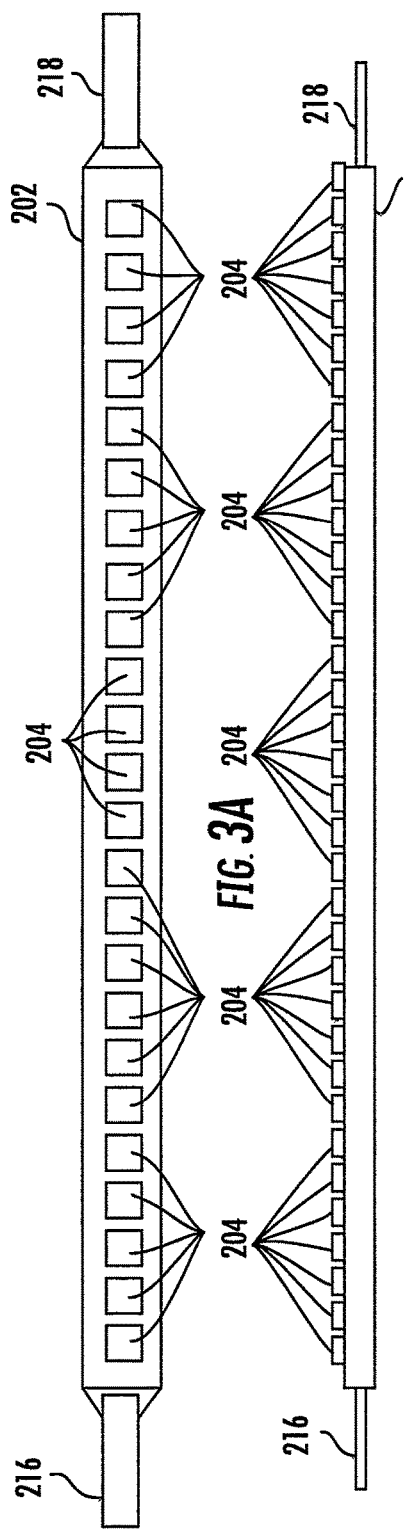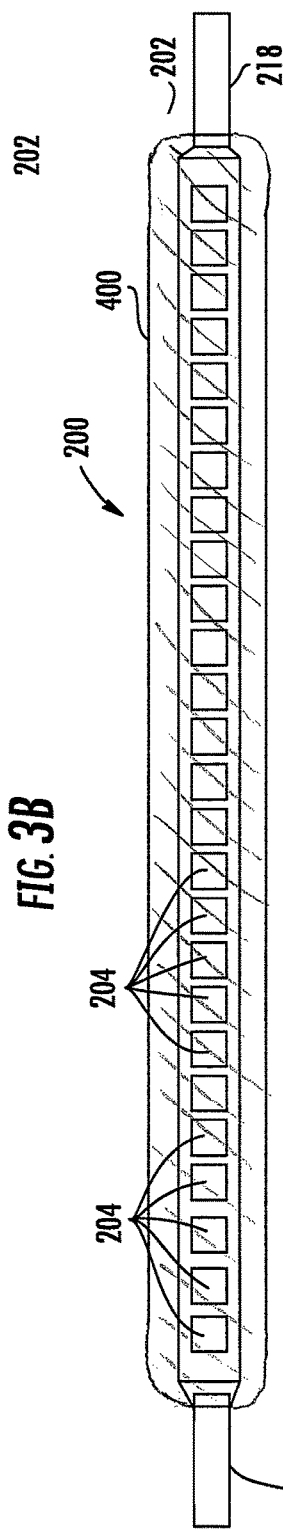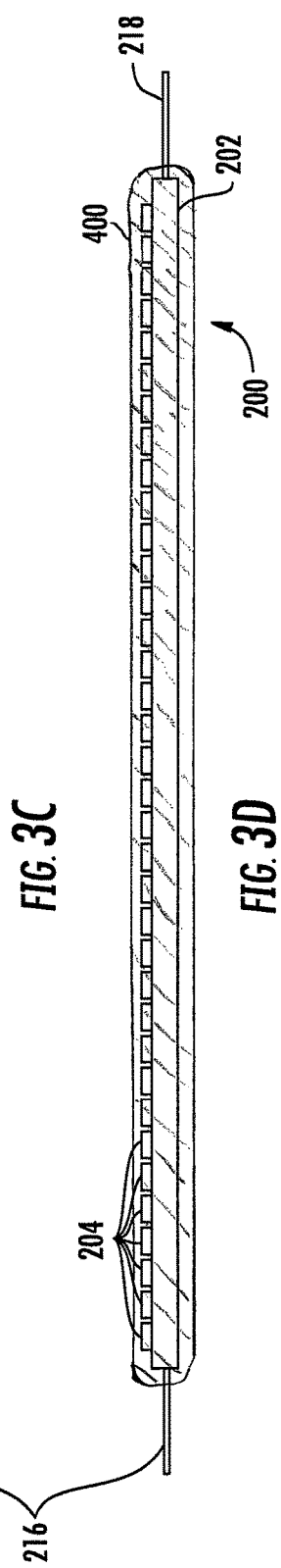

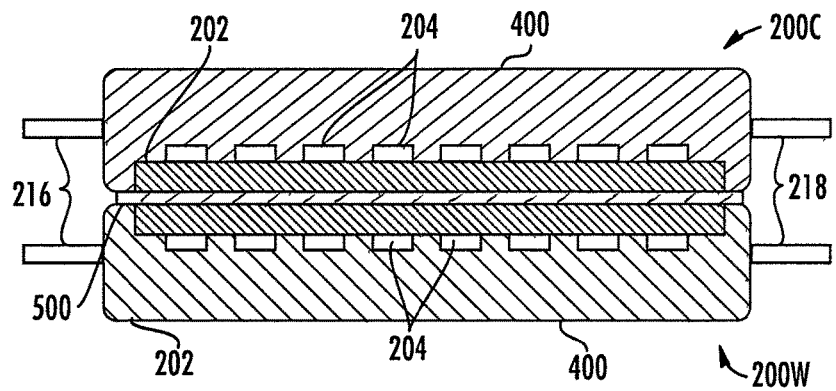
FIG. 8
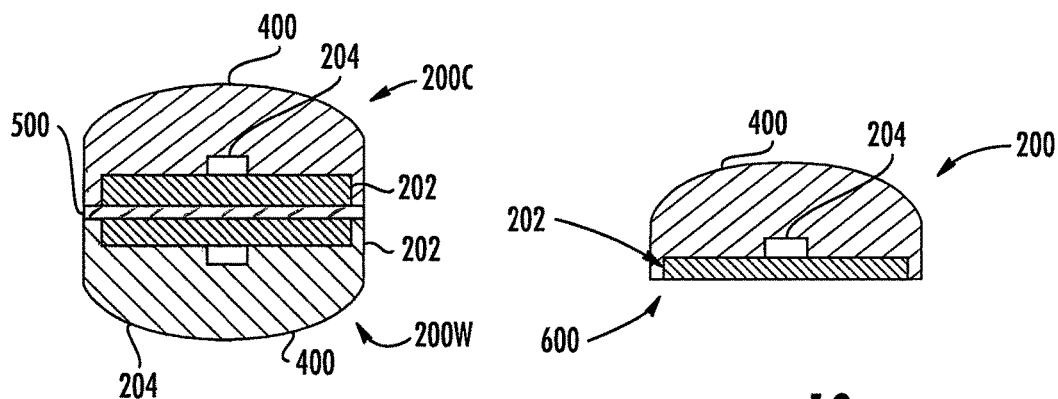
FIG. 9
FIG. 10
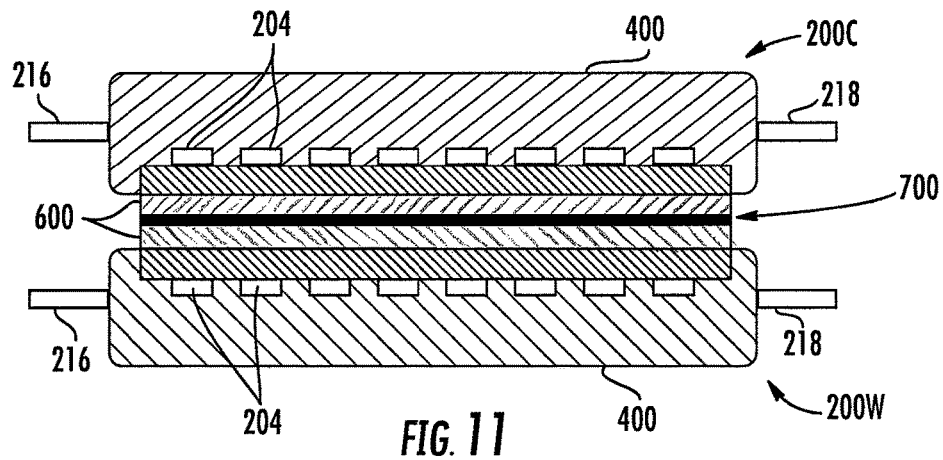
FIG. 11

SOLID-STATE LAMP WITH LED FILAMENTS HAVING DIFFERENT CCT'S

BACKGROUND

Light emitting diode (LED) lighting systems are becoming more prevalent as replacements for legacy lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver any color light, and generally contain no lead or mercury. A solid-state lighting system may take the form of a luminaire, lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs, which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. Since, ideally, an LED lamp designed as a replacement for a traditional incandescent or fluorescent light source needs to be self-contained; a power supply is included in the lamp structure along with the LEDs or LED packages and the optical components.

SUMMARY

In some embodiments a lamp comprises an optically transmissive enclosure for emitting an emitted light and a base connected to the enclosure. At least one first LED filament and at least one second LED filament are located in the enclosure and are operable to emit light when energized through an electrical path from the base. The first LED filament(s) emits light having a first correlated color temperature (CCT) and the second LED filament(s) emits light having a second CCT that are combined to generate the emitted light. A controller operates to change the CCT of the emitted light when the lamp is dimmed.

The optically transmissive enclosure may be transparent. The first LED filament(s) and the second LED filament(s) may be arranged in pairs. The first CCT may be warmer than the second CCT and the first LED filament in each one of the pairs of LED filaments may be disposed outside of the second LED filament in the each one of the pairs of LED filaments. The first LED filament(s) and the second LED filament(s) are independently controlled by the controller. The base may contain a power supply. The first LED filament(s) and the second LED filament(s) may be bonded together by a bonding material. The first LED filament(s) may comprise a plurality of first LEDs encapsulated in a first lumiphoric material and the second LED filament(s) may comprise a plurality of second LEDs encapsulated in a second lumiphoric material. The first lumiphoric material and the second lumiphoric material may be different. The first LED filament(s) may comprise a plurality of first LEDs mounted on a front side of a first optically transmissive substrate and the second LED filament(s) may comprise a plurality of second LEDs mounted on a first side of a second optically transmissive substrate where a backside of the first substrate may include a first reflector layer and a backside of the second substrate may include a second reflector layer. The first reflector layer and the second reflector layer may be bonded together. The first LED filament(s) may comprise a plurality of first LEDs mounted on a substrate and the second LED filament(s) may comprise a plurality of second LEDs mounted on the substrate.

In some embodiments a method of operating an LED lamp having an optically transmissive enclosure for emitting an emitted light, the method comprises energizing at least one first LED filament to emit a first light having a first correlated color temperature (CCT) and energizing at least one second LED filament to emit a second light having a second correlated color temperature (CCT); combining the first light and second light to create the emitted light; changing the CCT of the emitted light when the lamp is dimmed. The method may further comprise lowering the luminous flux of at least one of the first light and the second light when the CCT of the emitted light is changed.

In some embodiments a lamp comprises an optically transmissive enclosure for emitting an emitted light and a base connected to the enclosure. At least one first LED filament and at least one second LED filament are in the enclosure and are operable to emit light when energized through an electrical path from the base. The first LED filament(s) emits light at a first color point and the second LED filament(s) emits light at a second color point where the first LED filament(s) and the second LED filament(s) are independently controlled to generate the emitted light with a controllable CCT and a controllable luminous flux. A controller operates to change the CCT of the emitted light when the luminous flux of the emitted light is changed.

A plurality of first LED filaments and a plurality of second LED filaments may be arranged in groups. The first color point may be warmer than the second color point and the first LED filament in one of the groups of LED filaments may be disposed outside of the second LED filament in the one of the groups of LED filaments. At least some of the plurality of first LED filaments and the plurality of second LED filaments in each of the groups may be bonded together. The plurality of first LED filaments may each comprise a plurality of first LEDs encapsulated in a first lumiphoric material and the plurality of second LED filaments may each comprise a plurality of second LEDs encapsulated in a second lumiphoric material. The enclosure may define a plurality of apertures that allow ambient air to flow into the enclosure.

BRIEF DESCRIPTION OF THE DRAWINGS

FIGS. 3A-3D are views showing an embodiment of the LED filament usable in the lamp of FIG. 1 in various stages of assembly.

FIG. 8 is a longitudinal section view of another embodiment of the LED filament usable in the lamp of the invention.

FIG. 9 is a transverse section view of another embodiment of the LED filament usable in the lamp of the invention.

FIG. 10 is a transverse section view of yet another embodiment of the LED filament usable in the lamp of the invention.

FIG. 11 is a longitudinal section view of still another embodiment of the LED filament usable in the lamp of the invention.

DETAILED DESCRIPTION

Figure 1:
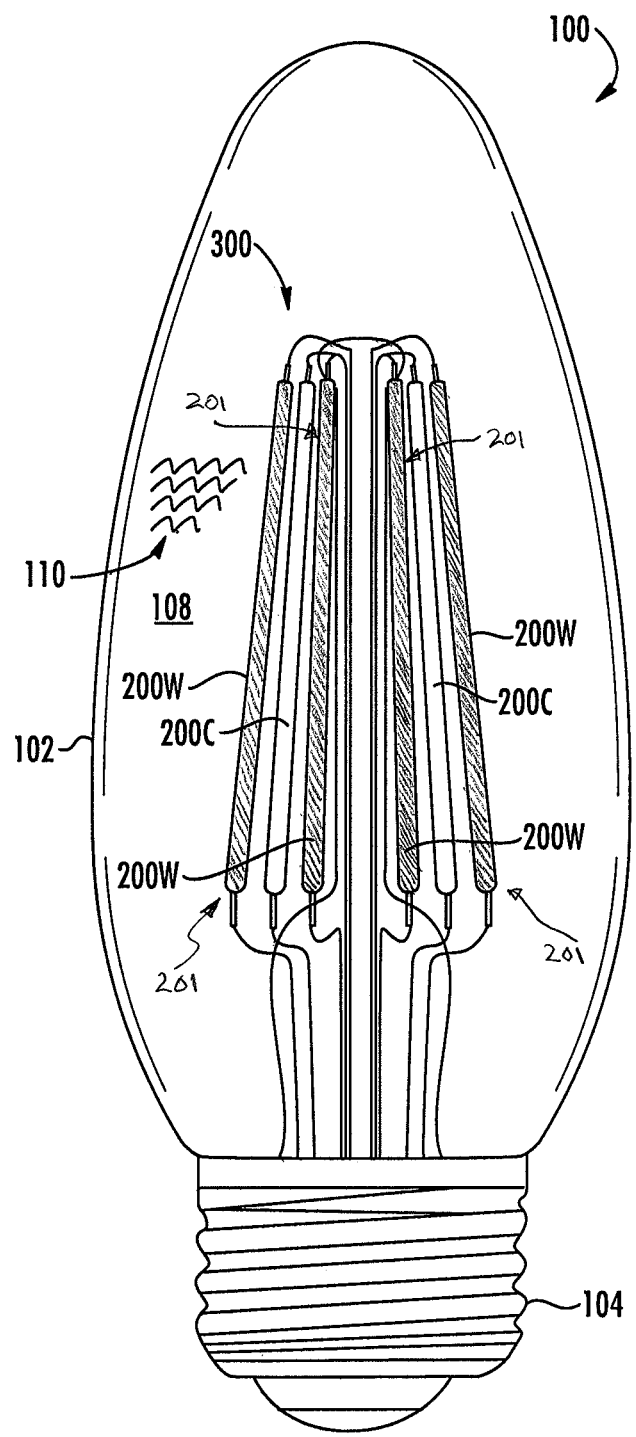
FIG. 1 is a side view of a lamp according to embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid-state light emitter" or "solid-state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid-state light emitters and/or multiple lumiphoric materials (i.e., in combination with at least one solid-state light emitter) may be used in a single device, such as to produce light perceived as white or near-white in character. In certain embodiments, the aggregated output of multiple solid-state light emitters and/or lumiphoric materials may generate light output having a color temperature range of from about 1200K to about 6500K.

Solid-state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid-state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials may be associated with a lumiphor, a lumiphor binding medium, or a lumiphor support element that may be spatially segregated from a solid-state emitter.

It should also be noted that the term "lamp" is meant to encompass not only a solid-state replacement for a traditional incandescent bulb as illustrated herein, but also replacements for complete fixtures, and any type of lamp or light fixture that may be custom designed as a solid state fixture.

An embodiment of the invention can find use in a lamp of any form factor or shape; however, embodiments of the invention can be especially useful in SSL bulbs dimensioned to replace incandescent bulbs such as A-series bulbs, G-series bulbs, candelabra bulbs and the like. The lamp of the invention has an appearance that mimics the appearance of a legacy incandescent bulb both when illuminated and when not illuminated and has an operation that mimics the operation of a legacy incandescent bulb when illuminated and during dimming operation. FIG. 1 illustrates an embodiment of a LED lamp 100 that has the form factor of a legacy candelabra bulb. Lamp 100 is dimensioned as a replacement for a candelabra-style incandescent bulb and includes an optically transmissive enclosure 102 and an Edison-type screw connector base 104. The Edison-type screw connector base 104 includes a power supply to provide the correct voltage and current to drive the LED or LEDs that serve as light sources for solid-state bulb 100, receiving line voltage as input through the Edison-type screw connection. The term "electrical path" is used to refer to the entire electrical path to the LEDs, including an intervening power supply and all the electronics in the lamp disposed between the electrical connection that would otherwise provide power directly to the LEDs and the LEDs. Electrical conductors run between the LEDs and the source of electrical power to provide critical current to the LEDs 204. It should be noted that any type of electrical connector may be used as base 104 could be used in a solid-state replacement bulb according to example embodiments of the present invention.

The enclosure 102 may be made of clear plastic or glass. The use of a clear enclosure may lessen the visual appearance of individual colors emitted by the LEDs in some embodiments and in some uses of the lamp. However, in some embodiments a diffusive enclosure may be used. The LED lamp is an omnidirectional lamp and gives off light in substantially all directions, and thus looks like a traditional incandescent candelabra bulb. While the lamp illustrated in FIG. 1 has the form factor of a candelabra bulb, the lamp may have any suitable form factor that provides omnidirectional illumination including standard form factors such as A-series (FIG. 15) and G-series bulbs and non-standard form factors including vintage style bulbs.

Figure 2:
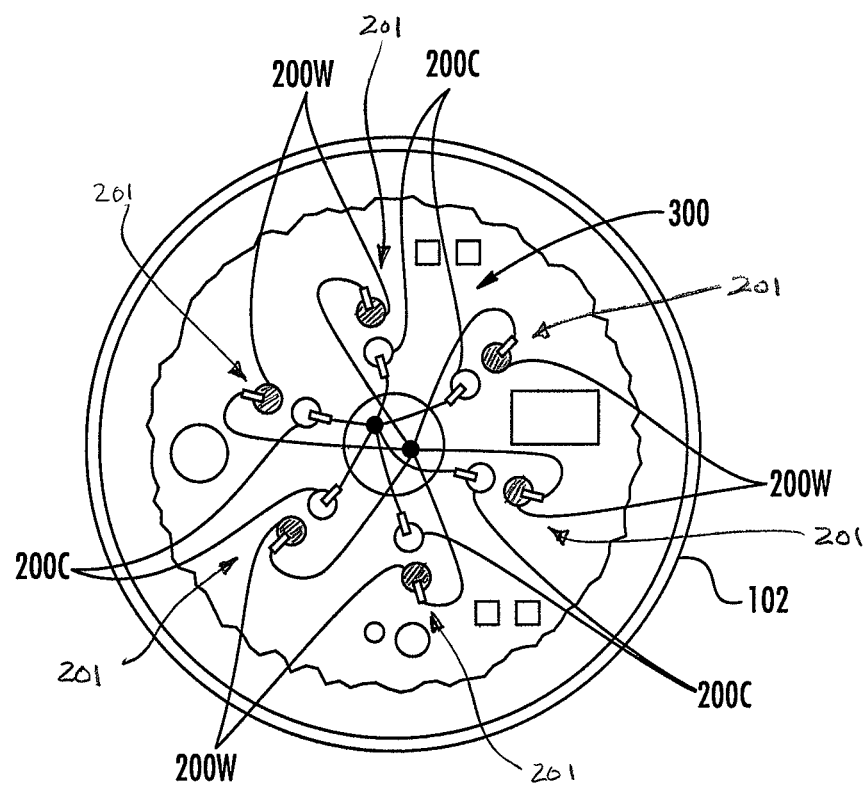
FIG. 2 is a top view of the lamp of FIG. 1 in which some of the internal components are visible.
Figure 4:
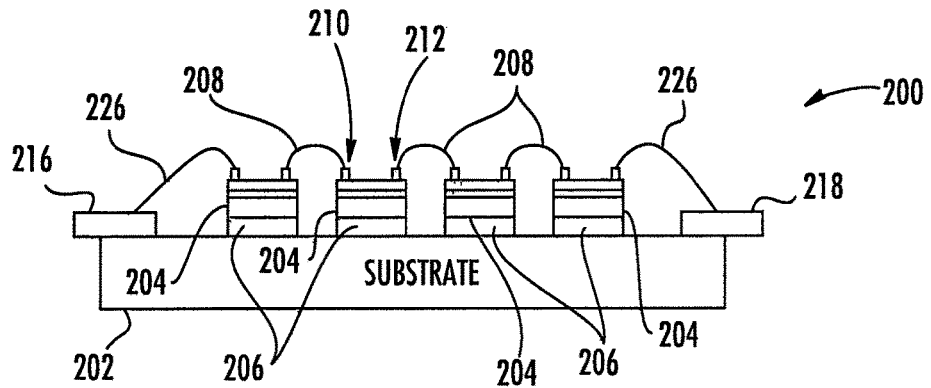
FIG. 4 is a side view showing details of an embodiment of the LED filament usable in the lamp of FIG. 1.

The enclosure 102 houses an LED assembly 300. FIGS. 1 and 2 show side and top views, respectively, of LED assembly 300 according to example embodiments of the invention. The LED assembly 300 includes at least one pair and in a typical embodiment a plurality of pairs 201 of LED strings or LED filaments 200. As used herein an LED filament 200 comprises a plurality of LEDs electrically connected together to form a filament-like chain or string where the LEDs extend along the length of the LED filament such that the LED filament has a relatively long and narrow configuration. In at least some embodiments, electrical pads for connecting the LED filament to the electrical path are located at the two ends of the LED filament. While the LED filaments shown in FIG. 1 extend in a linear manner the LED filaments may have other configurations than linear. The LED filaments 200 mimic the size and shape of an incandescent bulb filament that has a relatively long narrow configuration. Moreover, like an incandescent filament the LED filament 200 may have a variety of shapes and may be disposed in the enclosure in a variety of patterns. In the illustrated embodiment the LED filaments are arranged to extend generally parallel to the longitudinal axis of the lamp from the base toward the distal end of the lamp to form a cage-style lamp. While one arrangement of the LED filaments is shown the LED filaments may be arranged in a variety of patterns. Reference number 200 is used herein to refer to LED filaments collectively and reference numbers 200$w$ and 200$c$ are used to distinguish between the LED filaments that emit light having different color points. In the figures the warmer LED filaments 200$w$ are shown with shading to visually distinguish the cooler LED filaments 200$c$ from the warmer LED filaments 200$w$ in the drawings.

An example embodiment of the LED filament 200 is shown in FIGS. 3A-3D and 4 in various stages of assembly. The LED filament 200 comprises a substrate 202 that physically supports a plurality of LEDs 204. The LEDs 204 may, for example, be mounted on the substrate by an adhesive layer 206. In this example embodiment, the LEDs 204 comprise LED chips that are connected in series by wire bonds 208. The wire bonds 208 may be formed between the electrical contacts of the LEDs such as the P-contact 210 and N-contact 212 of the electrically adjacent LEDs in the string. It is possible to connect the LEDs 204 on a substrate other than as shown in a different electrical arrangement with different wiring. For example a lead frame arrangement may be used to form the electrical connections and/or the electrical pads 216, 218 that connect the LED filament 200 to the electrical path.

It should be noted that the term "substrate" as used herein is distinct from the semiconductor "substrate" layer of a chip such as the LED chips. The term "substrate" as used herein refers to substrate 202 and other similar substrates discussed herein and means the submount for supporting multiple LEDs 204 in the LED filament 200. The substrate 202 may be of any suitable material and, in addition to physically supporting the LEDs 204, substrate 202 may be used to transfer heat from the LEDs 204 to the gas in enclosure 102. The substrate may comprise glass, alumina, quartz or the like, or a metal such as aluminum or copper, and in some embodiments the substrate may be transparent. The substrate has a relatively flat, narrow, elongated configuration to define the filament structure of the LED filaments 200.

As illustrated, LED filament 200 includes 24 LED chips 204 connected in series, but any number of LED chips or devices can be used, from two or three chips up to 16, 20, 24, or even more depending on the length of the LED filament desired, and the size and voltage characteristics of the LED chips and the driver of the lamp, and/or the desired lumen output of the lamp. In one embodiment six LED filaments may be used with 6-8 LEDs per LED filament. Larger LEDs and/or more LEDs may be used to increase the wattage and luminous flux of the lamps as desired. Pads 216 and 218 may be fastened to the ends of the substrate, one on each end. These pads can be fastened to the substrate by force-fitting, with toothed springs, by adhesive, or in any other way. In one embodiment a lead frame structure may be bonded to the substrate 202 to create the electrical pads 216, 218. The lead frame structure may be bonded to the substrate using a metallization bond or an Ag epoxy or other suitable bonding process. Each pad provides a connection point to the filament-like chain of LED chips, through a wire, such as wire bonds 226 connected to pads 216, 218. The pads are then electrically coupled to the power supply in base 104 via wires 220 or other electrical connectors to complete the electrical path from the base 104 to the LEDs 204 to provide critical current to the LEDs. The embodiments described above make use of a plurality of LED chips electrically connected together to form a filament-like chain using an elongated, heat-dissipating substrate to support the plurality of LED chips. Such an LED assembly can serve as an improved LED filament for a lamp in terms of life of the LED chips, since the LED chips can be cooled more effectively. Such a substrate may be metal or thermally conductive ceramic.

Figure 5:
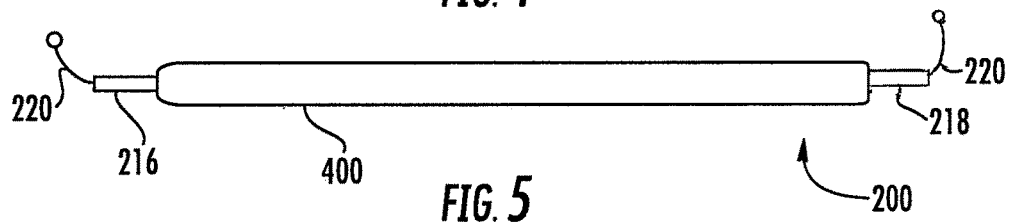
FIG. 5 is a side view of an embodiment of a complete LED filament.
Figure 6:
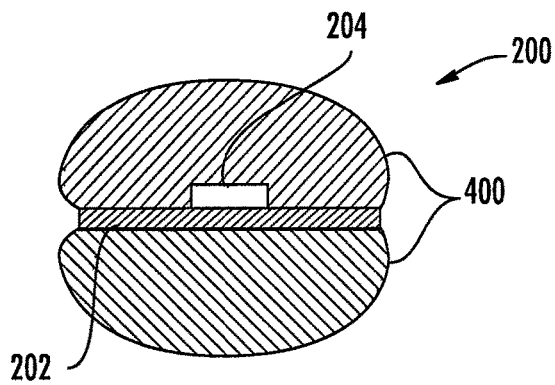
FIG. 6 is a transverse section view of the LED filament of FIG. 5.

The LEDs may be surrounded by or encapsulated in a lumiphoric layer 400. The lumiphoric layer 400 may comprise a silicone encapsulant containing phosphor. It should be noted that the lumiphoric layer 400 can be thin or thick. It should also be noted that reference to the phosphor or phosphor layer herein as surrounding or encapsulating the LED chips 204 is not meant to imply that it must touch all sides of the chips, as the sides of the chips against the substrate 202 (the "bottoms" of the chips) will often be phosphor free. All that is meant is that the lumiphoric layer is generally around and on top of the chips. In some embodiments, the lumiphoric layer is thin enough to follow the contours of the LED chips to some extent while in other embodiments the lumiphoric layer 400 may be relatively thicker such that the filament has a generally uniform thickness as shown in FIG. 5. It should also be noted that the term "phosphor" as used herein can refer to any phosphor particles themselves, or the suspension that is applied, which would typically be a liquid or gelatinous material with the phosphor particles suspended therein. This material can be made to solidify over time or with the application of ultraviolet light, at which point the phosphor particles are fixed in place on the side of the elongated, heat-dissipating substrate in proximity with the LED chips. A thinner lumiphoric layer would also allow more light from the LED chips to penetrate and mix with the light that has been converted to another wavelength by the phosphor. The thickness of the lumiphoric layer 400 can thus be varied to fine tune the color of light emitted by the LED filament assembly. In some embodiments the back and edges of the substrate are left un-coated regardless of the lumiphoric layer thickness, such that the exposed portions of the substrate can make efficient thermal contact with any thermal constituent gas in a lamp and provide for efficient cooling of the LED chips during operation. In other embodiments where thermal contact between the substrate and the gas in the enclosure is not necessary the back and/or edges of the substrate may be coated with the lumiphoric layer which may prevent blue light leakage from the filament. In some embodiments where a transparent substrate is used the lumiphoric layer 400 may cover the back side and top side of the substrate and the LEDs but may not completely cover the thin sides of the substrate where the minimal leakage of blue light is inconsequential as shown in FIG. 6. The LED assembly with the lumiphoric layer applied, when illuminated, has a substantially thin, elongated filament-like appearance.

Figure 7:
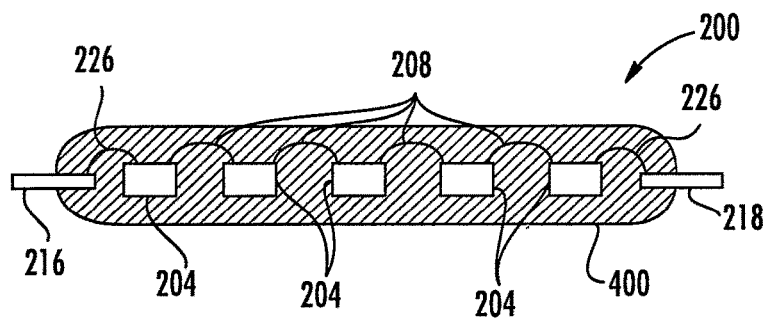
FIG. 7 is a longitudinal section view of the LED filament of FIG. 5.

Referring to FIG. 7, in some embodiments the substrate 202 may be eliminated and the LEDs 204 may be supported by the electrical connectors 208 that also electrically couple the LEDs together and to the electrical path. The LEDs may then be covered by a phosphor layer 400 to complete the LED filament 200.

Note that in some figures the sizes and spacing of LEDs 204 and other components may be enlarged for clarity. The figures are schematic in nature and may not be to scale.

In one embodiment the enclosure 102 may be sealed to the base 104 to create an airtight seal therebetween. The interior space 108 of the enclosure 102 may be filled with a heat conductive gas 110 such as Helium, Argon, Nitrogen or the like to create a more efficient heat conductive path between the LED assembly 300 and the enclosure 102 to facilitate the transfer of heat away from the LEDs and to the ambient environment.

Figure 15:
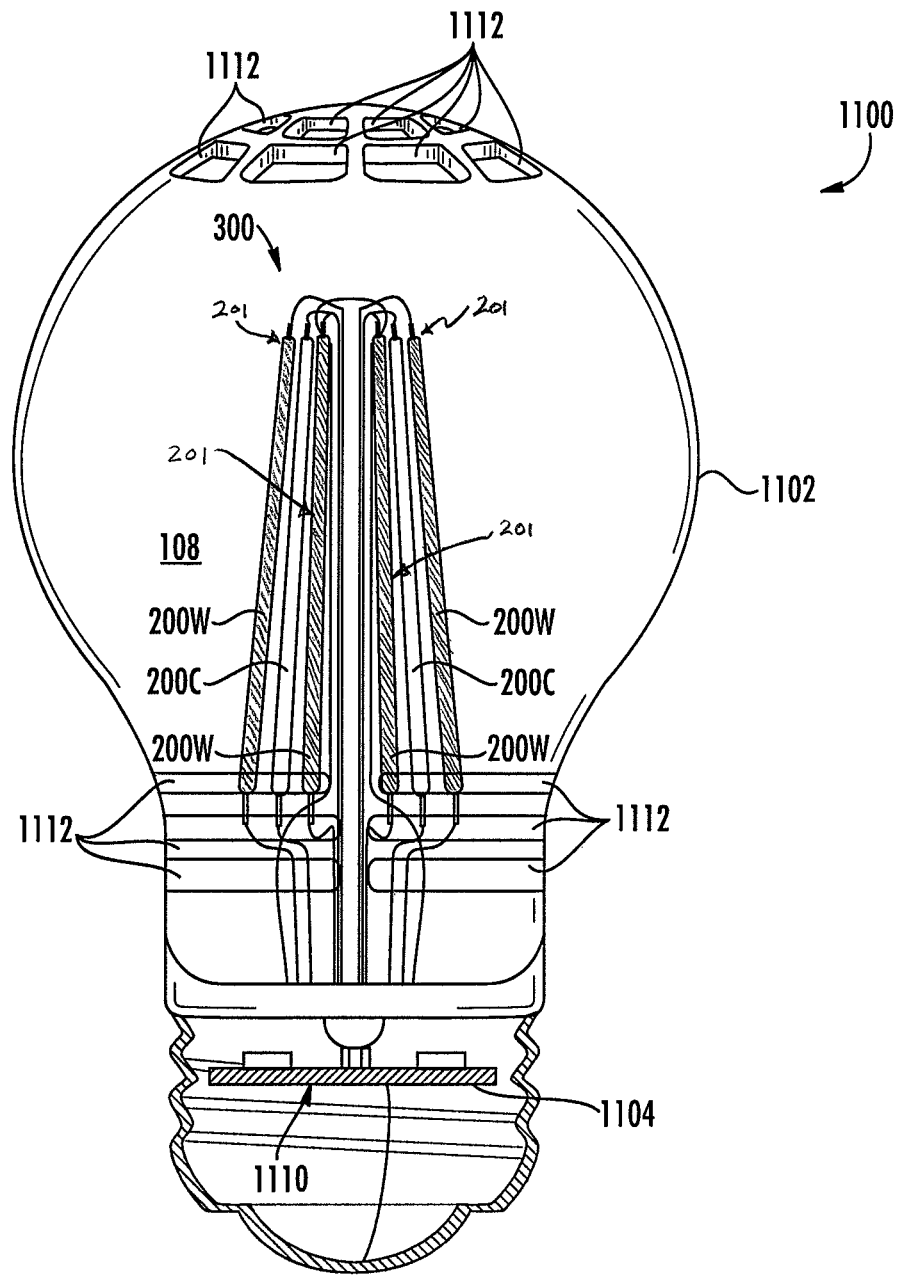
FIG. 15 is a partial section side view of a lamp according to other embodiments of the invention.
Figure 16:
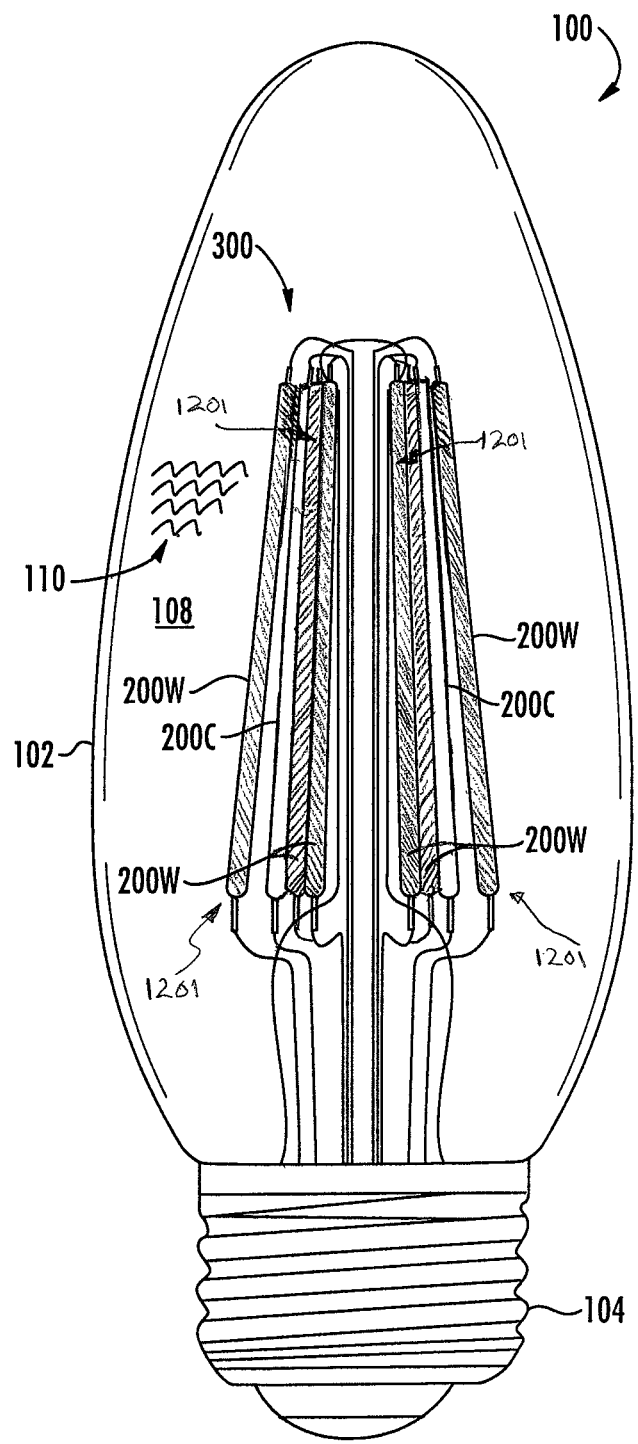
FIG. 16 is a side view of a lamp according to other embodiments of the invention.
Figure 17:
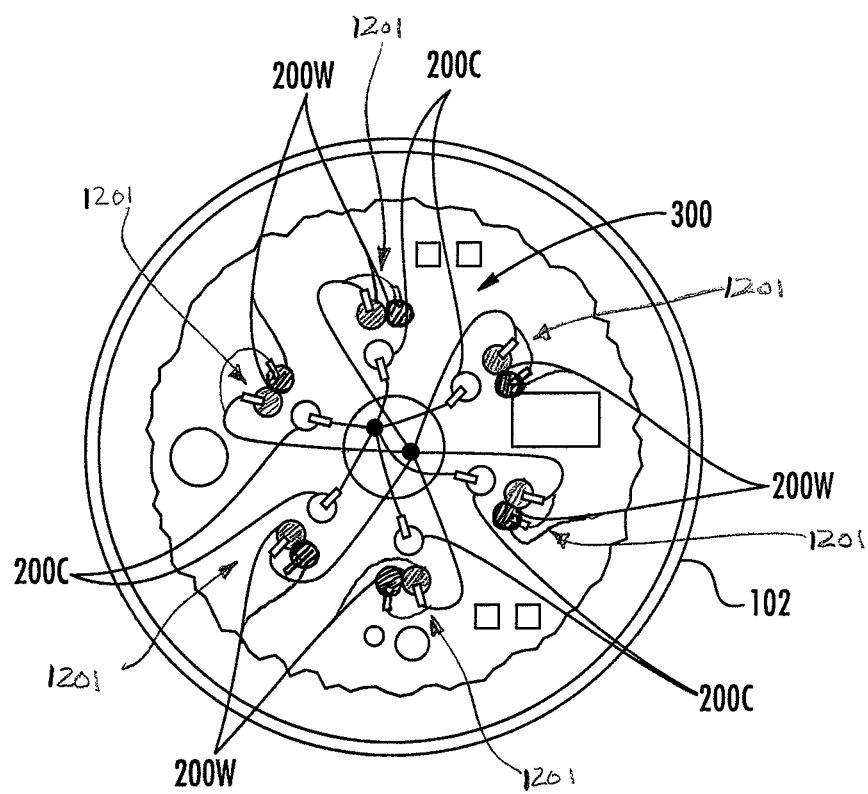
FIG. 17 is a top view of the lamp of FIG. 16 in which some of the internal components are visible.

FIG. 15 shows another embodiment of the lamp of the invention 1100 having the form factor of an A-series bulb with the base 1104 shown in cross-section. The lamp 1100 comprises an optically transmissive enclosure 1102 and a base 1104 that are connected together to form the lamp 1100 having the dimensions and configuration of an A19 bulb. A LED assembly 300 having warm LED filaments 200w and cool LED filaments 200c is supported in the enclosure and is configured to emit dimmable light when energized through an electrical path from the base 1104. Lamp electronics 1110 are supported in the base 1104 and include the driver circuitry for driving the LED s as will be described. The base 1104 may be thermally isolated from the enclosure 1102 by suitable potting or the like. Suitable electrical conductors, such as wires, spring contacts or the like, electrically couple the base 1104 to the lamp electronics 1110 and the lamp electronics to the LEDs in LED assembly 300. In the embodiment of FIG. 15 apertures 1112 are created in the enclosure 1102 to allow air to flow through the enclosure to cool the LEDs. Various techniques and methods of thermal management and cooling the LEDs may be used in any of the embodiments described herein. As previously described, the enclosure 1102 may be made of clear plastic or glass. The use of a clear enclosure may prevent the visible appearance of different color light sources on the surface of the enclosure in some embodiments and in some uses of the lamp. However, in some embodiments a diffusive enclosure may be used.

A lamp according to embodiments of the invention comprises at least two light emitting LED filaments 200w, 200c each of the two LED filaments having a different spectral output to emit light at two different color points. In the embodiment shown in FIGS. 1, 2 and 15, the lamp has twelve LED filaments arranged in pairs 201 where one LED filament of the pair has a different spectral output than the other LED filament of the pair. Specifically, LED filaments 200c have a first spectral output and LED filaments 200w have a second spectral output. In the illustrated embodiment, the LED filaments 200c have a first color point or correlated color temperature (CCT) and the LED filaments 200w have a second color point or CCT. Specifically, the second CCT may be a warmer CCT than the first CCT.

For general lighting applications the lamp of the invention may emit light with a CCT of between approximately 1200K to 6500K, depending on the CCTs of the LED filaments used. In this particular example, the color of the light generated by the LEDs is indicated by reference number 200w to indicate LED filaments that emit a relatively warmer light and by reference number 200w to indicate LED filaments that emit a relatively cooler light. In this example embodiment, the cooler LEDs 200c may emit light with a CCT of up to 6500K and the warmer LEDs 200w may emit light with a CCT as low as 1200K. The CCTs are provided by way of example only such that the CCTs of the LEDs may be selected to achieve a desired range of CCT of the light emitted from the lamp. For example a warm light in the 1200K to 2200K may be a red/orange light such as typically seen in a low dimmed candelabra or A-series bulb. The lamp may operate on full power in the 2400-3000K range but may be operated up to 5700K to provide a cool emitted light. By disproportionate dimming of the LED filaments 200w and 200c based on their spectral output, the color temperature of the light emitted from the lamp can be reduced along with the light output (luminous flux) when the lamp itself is dimmed (luminous is lowered). The mechanism for such dimming will be discussed below. Note a mixture of LEDs with differing spectral outputs may be used in each of the LED filaments 200c and 200w provided that the color points of the two LED filaments 200c and 200w are different. A lamp in which the CCT of the emitted light changes when dimmed can be implemented using the LED filaments as described herein in many kinds and sizes of LED lamps with various LED spectral outputs.

As previously described, in one embodiment one LED filament 200w of each pair 201 of LED filaments comprises a "warm" filament and one LED filament 200c of each pair 201 of LED filaments comprises a "cool" filament where the warm and cool filaments are independently operable using a 2-channel driver such that the color temperature and light output of the lamp may be controlled. While six pairs 201 of filaments are shown, a lamp with 2, 4, 8 pairs of LED filaments, or a greater or fewer number of pairs of LED filaments may be used. The two different types of filaments with two different color points are used to allow the lamp to be dimmed and simultaneously change color such that the operation of the lamp can mimic the color change associated with a dimmable incandescent bulb. Dimmed as used herein means that the luminous flux of the light emitted from the lamp is lowered.

To dim the lamp, the light output of the lamp is lowered and the CCT of the light emitted from the lamp is also tuned warmer. Specifically, when the lamp is dimmed, for example by a lowering of the input line voltage the luminous flux generated by one or both of the types of LED filaments 200w, 200c is lowered to lower the luminous flux emitted by the lamp. Concurrently the light output of the cool LED filaments 200c is lowered relative to the light output of the warm LED filaments 200w, or the light output of the cool LED filaments 200c is turned off completely, such that light is primarily or exclusively emitted from the warmer LED filaments 200w such that the CCT of the light emitted from the lamp is made warmer as the lamp is dimmed. The reduction in light output of the cooler LED filaments 200c relative to the light output of the warmer LED filaments 200w changes the color mix of the light generated by the two types of LED filaments such that the light emitted from the lamp grows warmer as the light output (luminous flux) of the lamp is reduced.

In one embodiment, the warmer LED filament 200w of the pair of LED filaments is disposed outside of the cooler LED filament 200c of the same LED filament pair such that as the lamp is dimmed and the light output of the lamp is lowered, the cooler LED filament 200c does not block the light emitted from the warmer LED filament 200w. Placed outside as used herein means that the warm LED filament 200w is disposed closer to the enclosure 102 than the cool LED filament 200c as shown in FIGS. 1 and 2. In some embodiments the LED filaments 200w, 200c may be radially arranged such that the warm and cool LED filaments are disposed on the same radial plane with the warm LED filament 200w disposed outside of the cool LED filament 200c. In other embodiments the warm LED filament 200w may be disposed outside of the cool LED filament 200c but the filaments may be radially offset from one another. In other embodiments the warm and cool LED filaments may be placed side-by-side one another.

In another example embodiment the warmer LED filament 200w and the cooler LED filament 200c may be bonded together such that the LED filaments form a single component in the assembled lamp as shown in FIGS. 8 and 9. The warmer LED filament 200w and the cooler LED filament 200c are made as previously described. The warmer LED filament 200w and the cooler LED filament 200c may be bonded together by a bonding material 500 to create a single component having both spectral outputs. The bonding material 500 may be a clear or reflective material such as silicone. Using a clear silicone as the bonding material will provide the best mixing between the warm and cool light emitted by the two LED filaments and may provide the most natural appearing filament. However, the use of a clear bonding material may make color control more difficult because the light from one of the LED filaments may bleed into the light output from the other one of the two LED filaments. Using a reflective material such as reflective silicone as the bonding material 500 maintains the two LED filaments optically isolated from one another and provides the better color control. However, using a reflective material as the bonding material 500 may result in a less efficient and dimmer LED assembly. As previously described in one embodiment the warmer LED filament 200w is positioned toward the outside of the cooler LED filament 200w in the LED assembly 300 such that as the lamp is dimmed and the light output of the lamp is lowered, the cooler LED filament 200c doesn't block the light emitted from the warmer LED filament 200w.

Referring to FIG. 10, in another example embodiment of the LED filament 200 the backside of the substrate 202 may be provided with a reflector layer 600. For example the back side of the substrate 202 may be coated with a reflective silicone. In this embodiment the reflective silicone is used as a reflective layer 600 but is not used to bond multiple LED filaments together as previously described with respect to FIGS. 8 and 9. In another embodiment the backside of the substrate 202 may be coated with a reflective material such as aluminum, silver stacks or a dielectric such as $TiO_2$ or $SiO_2$. These layers may have a higher reflectivity than the reflective silicone and are relatively inexpensive and easy to apply. The reflective layer 600 may also be in the form of a metalized layer applied to the back side of the substrate. In this and in other embodiments described herein the substrate may be made of an opaque but reflective material such as an alumina silicate.

Referring to FIG. 11, in another example embodiment of the LED filament 200 each LED filament 200 having a reflective layer applied to the back side of the substrate as described with respect to FIG. 10, may be bonded together at a bond layer 700 to create a single component having plural LED filaments where an epoxy or other adhesive is used between the reflective layers 600 to bond the LED filaments 200c, 200w together. In other example embodiments the bond layer 700 may be formed by a metal to metal bond or by using an Ag epoxy.

While in the previous embodiments two LED filaments are joined together to create a single component, each component may include more than two filaments bonded together. For example each component may include two pairs of warm and cool LED filaments. Likewise in the embodiment of FIGS. 1 and 2 the LED filaments may be arranged as more than a pair of warm and cool LED filaments. For example, two cool LED filaments and two warm LED elements may be arranged together. In some embodiments the warmer LED filaments and the cooler LED filaments are arranged in a one-to-one relationship.

Figure 12:
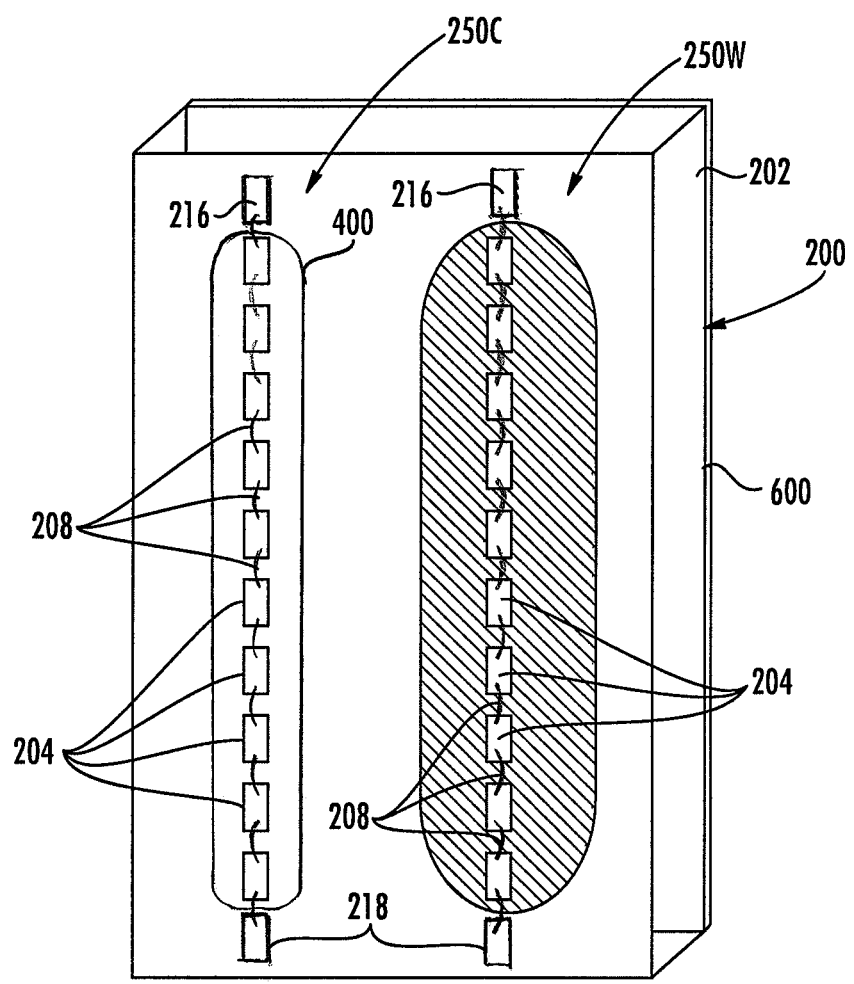
FIG. 12 is a perspective view of still another embodiment of the LED filament usable in the lamp of the invention.

Referring to FIG. 12, in another example embodiment of the LED filament 200 a single substrate 202 may be used for more than one string of LEDs such that, for example, a warm string of LEDs creates warmer LED filament 250w and a cool string of LEDs creates cooler LED filament 250c are supported on a single substrate 202. As previously described the backside of the substrate 202 may be provided with a reflector layer 600 as described with respect to FIG. 10. In still another embodiment a substrate supporting more than one LED string such as shown in FIG. 12 may be bonded to a second substrate supporting at least one LED string to create a single component having plural LED strings as previously described with respect to FIG. 8.

Figure 18:
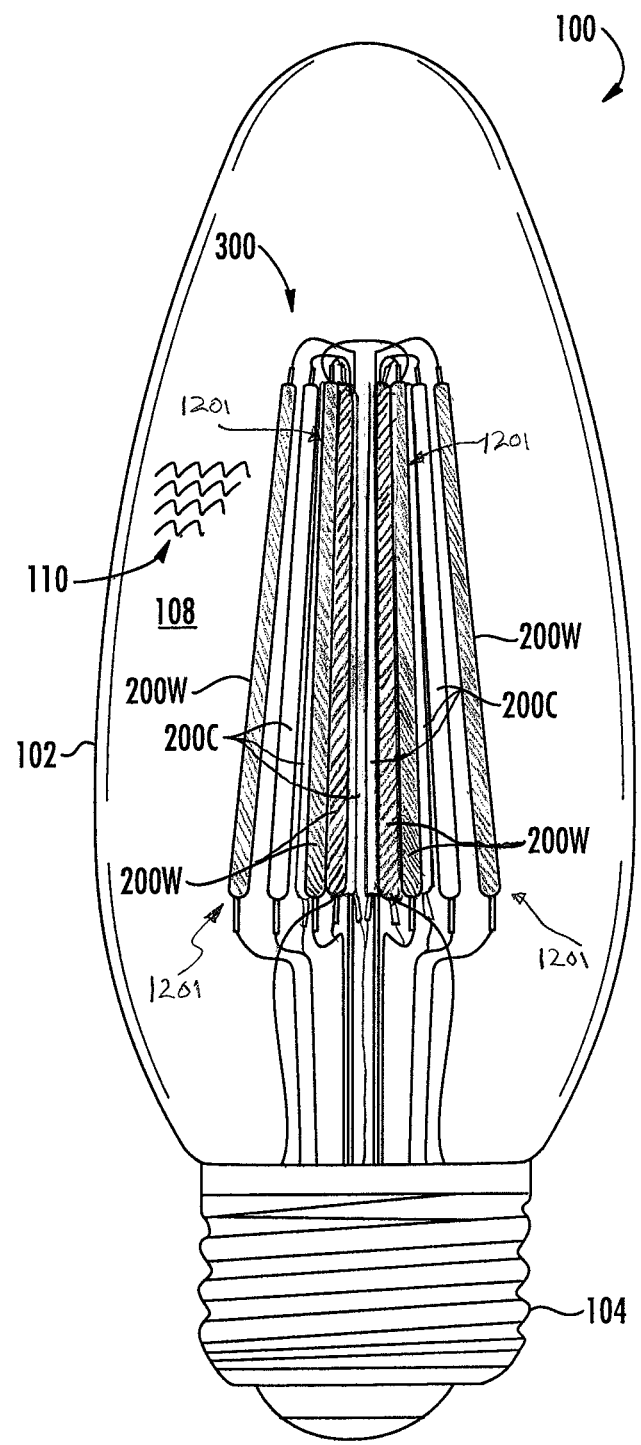
FIG. 18 is a side view of a lamp according to still other embodiments of the invention.
Figure 19:
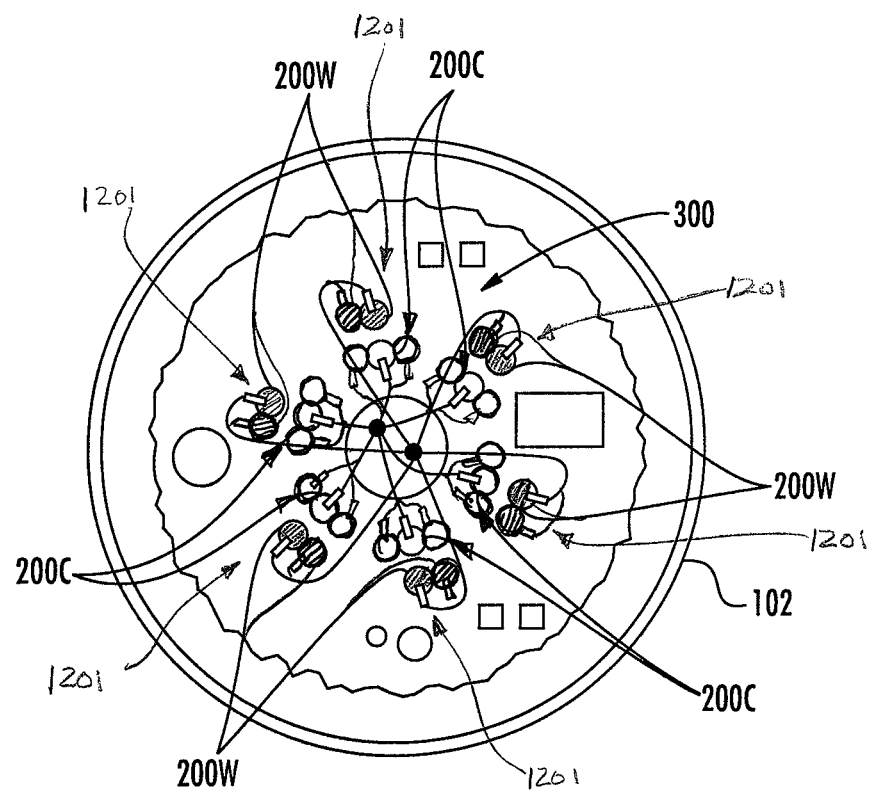
FIG. 19 is a top view of the lamp of FIG. 18 in which some of the internal components are visible.

In some embodiments the warm and cool LED filaments 200w, 200c are arranged in pairs 201 as shown in FIGS. 1, 2 and 15. While in the illustrated embodiments an even number of LED filament pairs are used, it is to be understood that an odd number of LED filaments may be used. Moreover the LED filaments may be arranged in groups 1201 of LED filaments that are not in pairs as shown in FIGS. 16-19. Each group or pair of LED filaments denotes LED filaments that are disposed in close spacial proximity relative to other LED filaments in the same group or pair and are spaced relatively farther from LED filaments in other groups or pairs. For example each group 1201 of LED filaments may include more than two LED filaments 200 including an even or an odd number of LED filaments such that the LED filaments in each group are not necessarily in a one-to-one relationship. For example, referring to FIGS. 16 and 17 each group 1201 of LED filaments includes two warmer LED filaments 200w and two cooler LED filaments 200c arranged in a group of four. Referring to FIGS. 18 and 19 each group 2201 of LED filaments includes two warmer LED filaments 200w and three cooler LED filaments 200c arranged in a group of five where the cooler LED filaments and the warmer LED filaments are not arranged in a one-to-one relationship. The groups of LED filaments may include a greater or lesser number of LED filaments than shown in the figures depending upon the desired light characteristics of the lamp including total luminous flux and the number of CCT's. In some embodiments each group of LED filaments may include a single LED filament where some of the LED filaments are warmer LED filaments and some of the LED filaments are cooler LED filaments.

As is well known in the lighting arts, the color temperature of an incandescent light bulb changes as the bulb is dimmed. This change typically amounts to several hundred degrees K of color temperature. The specifics vary from one type of bulb to another, but as an example, a typical household incandescent "Edison" style bulb has a full illumination temperature of about 2700° K and dims to a warmer 2200° K at about 10% of full illumination or even warner CCT at lower illumination levels. An incandescent candelabra bulb may dim to a warmer 1800° K at about 10% of full illumination. LEDs typically actually grow cooler in color temperature as drive current is reduced. Thus, simply dimming an LED light source in the same manner as an incandescent bulb produces an unnatural result with respect to color temperature change as compared to a legacy incandescent bulb. Embodiments of the present invention produce a more natural warming of the color temperature of a lamp when the lamp is dimmed.

As previously discussed, a lamp according to example embodiments of the present invention has at least two differing spectral outputs with one of the spectral outputs generated by one type of LED filament and the other one of the spectral outputs generated by a second type of LED filament. In some embodiments, a plurality of LED chips are disposed in a single LED filament and the LED filaments are wired so that the same types of LED filaments are individually addressable. For example all of the warmer LED filaments 200w are controlled together and all of the cooler LED filaments are controlled together but the warmer LED filaments are controlled independently of the cooler LED filaments. As previously explained, in some embodiments light is emitted from the lamp with a correlated color temperature of from approximately 1200K to 6500K, depending on the CCTs of the LED filaments used. In some embodiments a lumiphoric layer is used to render these colors from the LEDs. By disproportionate dimming of the light emitters based on the CCT of the LED filaments, the color temperature of the light from the lamp can be reduced (made warmer) when the lamp is dimmed. The mechanism for such dimming will be discussed below with reference to FIG. 13.

Figure 13:
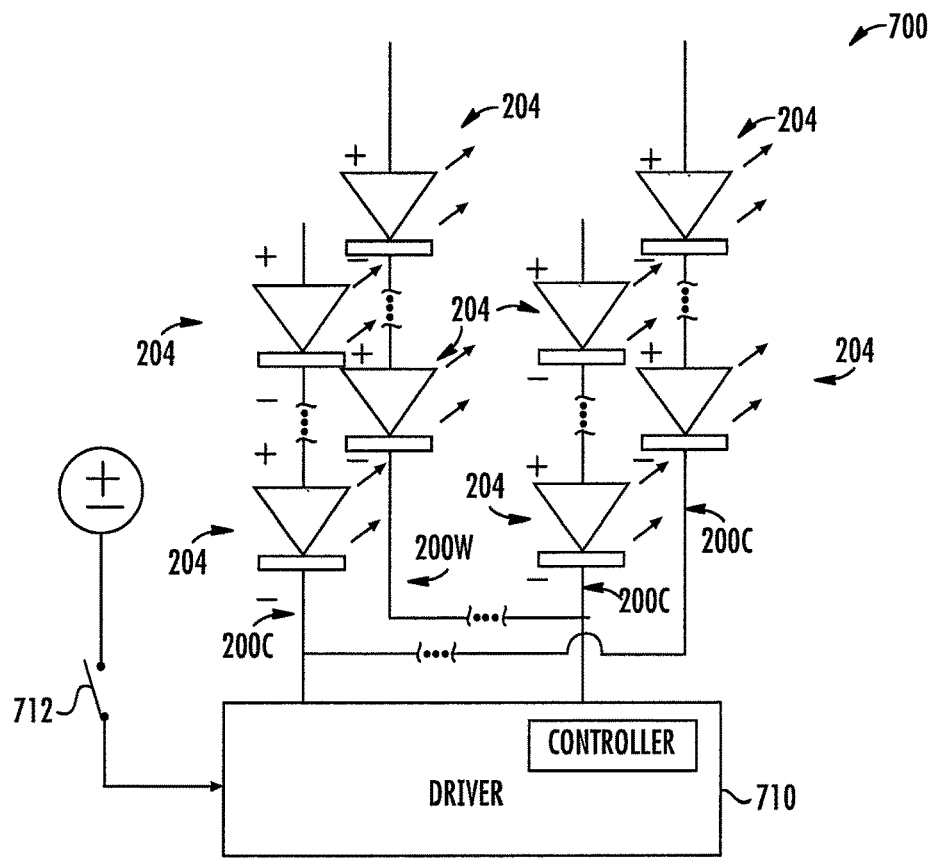
FIG. 13 is an electronic schematic diagram illustrating a portion of the circuitry of a lamp according to at least some embodiments of the present invention.
Figure 14:
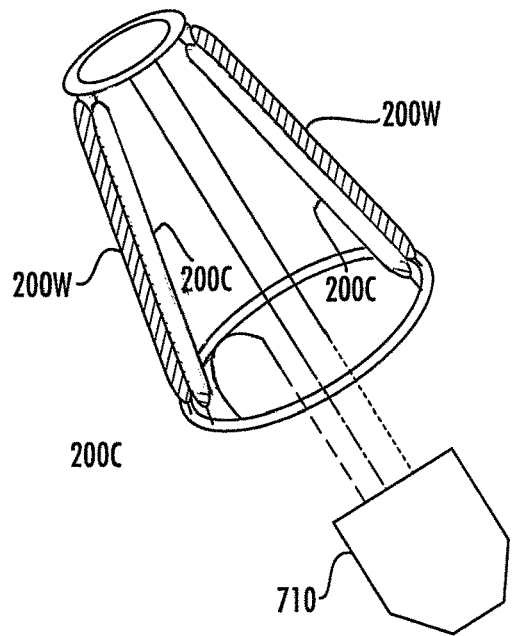
FIG. 14 is a simplified schematic diagram showing a portion of the wiring layout of a lamp according to at least some embodiments of the present invention.

FIGS. 13 and 14 illustrate an embodiment of a circuit configuration 700 used in the example candelabra lamp described with respect to FIGS. 1 and 2. LED filaments 200w are warmer LED filaments as previously described. LEDs filaments 200c are cooler LED filaments as previously described. The warmer LED filaments 200w and cooler LED filaments 200w are shown arranged in pairs 201 as previously described. Each LED filament 200w, 200c may include any suitable type and number of LEDs 204 to generate light of at a desired color point where each of the different types of LED filaments generate light at a different color point. In the illustrated embodiment two types of LED filaments 200c, 200w are used that generate light of two different color points, e.g. warm and cool. Any suitable number of LED filaments 200c, 200w may be used to obtain a desired light output for the light emitted from the lamp. Driver 710 individually addresses the two different types of LED filaments 200c and 200w. When the line voltage input to driver 710 is reduced due to manipulation of a dimmer 712 in the circuit, the driver 710 reduces the drive current of the cool LED filaments 200c more than the drive current of the warm LED filaments 200w. In some embodiments the cooler LED filaments 200c may turned off completely. This disproportionate change in the drive current of the cool and warm LED filaments causes the overall light from the lamp to become warmer as the lamp is dimmed in much the same way that the color of light from an incandescent bulb warms when the bulb is dimmed.

Driver 710 of FIG. 13 includes the control circuitry to manage the disproportionate dimming of the LED filaments 200w, 200c; however, the control circuitry could be separated from the driver and, for example, be mounted on a separate circuit board. The control circuitry can include, for example, a controller 714 such as a microcontroller that directs a separate driver circuit for each type of LED filament, possibly in accordance with feedback from an internal light sensor. In a LED lamp, at least most of the driver or power supply is disposed in the base 104 of the lamp. The LED or LEDs of the LED filaments 200c and 200w is/are connected through the electrical path to the power supply to be operable to provide the light of at least two different color points where the power supply selectively dims at least some of the light emitters in one of the LED filaments, e.g. 200c, when the lamp is dimmed through an architectural control, such as a dimmer switch 712, in the same manner as an incandescent bulb would normally be dimmed.

In one example embodiment, light is emitted from the lamp with a correlated color temperature of up to 6500K that is reduced when the lamp is dimmed. In a specific example, the CCT of the light from the lamp is about 2700K and dims to about 1800-2200K at 10% power, much the same as a typical incandescent bulb. This dimming profile is accomplished using LED filaments 200w with a spectral output having a CCT of about 1800K in combination with LED filaments 200c having a spectral output having a CCT of about 4000K. The cooler LED filaments 200c are essentially turned off at full dimming. Various types of LED devices can be used and driving circuitry modified accordingly to alter these color temperatures.

The warmer and cooler LED filaments can be any of various spectral outputs. As additional examples, the spectral outputs with CCTs of 1800K and 2700K can be used. A lamp with such devices may produce generally warm light at full brightness with both the 1800K and 2700K illuminated and would then become warmer still when dimmed by turning off the higher CCT LED filament (the 2700K filament) leaving the warmer 1800K LED filament illuminated as described herein. Single colors and non-phosphor converted colors can also be used. Additional single or saturated color LEDs can be added to fill-in portions of the light spectrum to make for more pleasing light or a higher CRI for the lamp. White light devices with spectral outputs having CCTs anywhere from 1200K to 5000K can be used together. As an example, a warmer LED filament may have a spectrum that runs from about 1200K to about 2700K, and a cooler LED filament may have a spectrum that runs from about 2200K to about 5000K. In some embodiments, a warmer LED filament may have a spectrum that runs from about 1200K to about 2200K, and a cooler LED filament have a spectrum that runs from about 2700K to about 4000K. In some embodiments different phosphor options may be used to produce light similar to incandescent quality. For example light with a CRI>90 and R9>50 may be produced. Examples of various phosphors that may be used to produce light having different CCT's is disclosed in U.S. Patent Application No. 2016/0372638 entitled "Light Emitting Devices Having Closely-Spaced Broad-Spectrum and Narrow-Spectrum Luminescent Materials and Related Methods" filed by Todorov et al. on Dec. 22, 2016, the contents of which is incorporated by reference herein in its entirety.

In some embodiments, a lamp can include a plurality of different types of LED filaments, where the LEDs of the least two different types of LED filaments (even if a LED filament only includes a single LED) have different spectral outputs. Such an embodiment would allow for more finely tuned color changes when dimming or under different conditions. As an example LED filaments with CCTs of 1800K, 2200K, 3200K, and 3600K can be used in an embodiment based on four different spectral outputs. Such an arrangement can be used, as an example to create a very reddish low candlelight color when moving from 2200K to 1800K during the dimming process.

A lamp according to any of the above or other embodiments can be assembled by assembling a power supply within the base of the LED lamp, connecting the LEDs in the LED filaments to the power supply, connecting an optically transmissive enclosure to the base of the LED lamp to enclose the at least one LED, filling the enclosure with a thermally conductive gas. The various portions of a solid-state lamp or lighting system according to example embodiments of the invention can be made of any of various materials. A system according to embodiments of the invention can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, screws, bolts, or other fasteners may be used to fasten together the various components.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:
an optically transmissive enclosure for emitting an emitted light;
a base connected to the enclosure;
at least one first LED filament and at least one second LED filament in the enclosure operable to emit light when energized through an electrical path from the base, the at least one first LED filament emitting light having a first correlated color temperature (CCT) and the at least one second LED filament emitting light having a second CCT that are combined to generate the emitted light, the at least one first LED filament and the at least one second LED filament being arranged in a plurality of groups where each group of the plurality of groups comprises at least one first LED filament and at least one second LED filament;
and a controller that changes the CCT of the emitted light when the lamp is dimmed.

2. The lamp of claim 1 wherein the optically transmissive enclosure is transparent.

3. The lamp of claim 1 wherein the first CCT is warmer than the second CCT and a first LED filament in each one of the groups of LED filaments is disposed outside of a second LED filament in the each one of the groups of LED filaments.

4. The lamp of claim 1 wherein the at least one first LED filament and the at least one second LED filament are independently controlled by the controller.

5. The lamp of claim 1 wherein the base contains a power supply.

6. The lamp of claim 5 wherein at least one first LED filament and the at east one second LED filament are bonded together by a bonding material.

7. The lamp of claim 5 wherein the at least one first LED filament comprises a plurality of first LEDs encapsulated in a first phosphor and the at least one second LED filament comprises a plurality of second LEDs encapsulated in a second phosphor.

8. The lamp of claim 7 wherein the first phosphor and the second phosphor are different.

9. The lamp of claim 1 wherein the at least one first LED filament comprises a plurality of first LEDs mounted on a front side of a first optically transmissive substrate and the at least one second LED filament comprises a plurality of second LEDs mounted on a first side of a second optically transmissive substrate wherein a backside of the first substrate includes a first reflector layer and a backside of the second substrate includes a second reflector layer.

10. The lamp of claim 9 wherein the first reflector layer and the second reflector layer are bonded together.

11. The lamp of claim 1 wherein the at least one first LED filament comprises a plurality of first LEDs mounted on a substrate and the at least one second LED filament comprises a plurality of second LEDs mounted on the substrate.

12. A method of operating an LED lamp having an optically transmissive enclosure for emitting an emitted light, the method comprising:
energizing at least one first LED filament of a first plurality of LED filaments to emit a first light having a first correlated color temperature (CCT) and energizing at least one first LED filament of a second plurality of LED filaments to emit a second light having a second correlated color temperature (CCT) where the at least one first LED filament of the first plurality of LED filaments and the at least one first LED filament of the second plurality of LED filaments are arranged at a first distance in close proximity to one another, and energizing at least one second LED filament of the first plurality of LED filaments to emit the first light having the first correlated color temperature (CCT) and energizing at least one second LED filament of the second plurality of LED filaments to emit the first light having the second correlated color temperature (CCT) the at least one second one of the first plurality of LED filaments and the at least one second one of the second plurality of LED filaments arranged at a second distance in close proximity to one another where the at least one first LED filament of the first plurality of LED filaments and the at least one first LED of the second plurality of LED filaments are spaced from the at least one second LED filament of the first plurality of LED filaments and the at least one second LED filament of the second plurality of LED filaments a third distance that is relatively greater than the first and second distances;
combining the first and second light to create the emitted light;
changing the CCT of the emitted light when the lamp is dimmed.

13. The method of claim 12 further comprising lowering the luminous flux of at least one of the first light and the second light when the CCT of the emitted light is changed.

14. A lamp comprising:
an optically transmissive enclosure for emitting an emitted light;
a base connected to the enclosure;
a plurality of first LED filaments and a plurality of second LED filaments in the enclosure operable to emit light when energized through an electrical path from the base, the plurality of first LED filaments emitting light at a first color point and the plurality of second LED filaments emitting light at a second color point where the plurality of first LED filaments and the plurality of second LED filaments are independently controlled to generate the emitted light with a controllable CCT and a controllable luminous flux, a first one of the plurality of first LED filaments and a first one of the plurality of second LED filaments are arranged at a first distance in close proximity to one another and a second one of the plurality of first LED filaments and a second one of the plurality of second LED filaments are arranged at a second distance in close proximity to one another where the first one of the plurality of first LED filaments and the first one of the plurality of second LED filaments are spaced from the second one of the plurality of first LED filaments and the second one of the plurality of second LED filaments a third distance that is relatively greater than the first and second distances; and
a controller that changes the CCT of the emitted light when the luminous flux of the emitted light is changed.

15. The lamp of claim 14 wherein the first color point is warmer than the second color point and the first one of the plurality of first LED filaments is disposed outside of the first one of the plurality of second LED filaments.

16. The lamp of claim 14 wherein at least some of the plurality of first LED filaments and the plurality of second LED filaments are bonded together.

17. The lamp of claim 14 wherein the plurality of first LED filaments each comprises a plurality of first LEDs encapsulated in a first phosphor and the plurality of second LED filaments each comprises a plurality of second LEDs encapsulated in a second phosphor.

18. The lamp of claim 14 wherein the enclosure defines a plurality of apertures that allow ambient air to flow into the enclosure.

19. A lamp comprising:
an optically transmissive enclosure for emitting an emitted light;
a base connected to the enclosure;
a plurality of first LED filaments and a plurality of second LED filaments in the enclosure operable to emit light when energized through an electrical path from the base, the plurality of first LED filaments and the plurality of second LED filaments arranged in pairs, the plurality of first LED filaments emitting light having a first correlated color temperature (CCT) and the plurality of second LED filaments emitting light having a second CCT that are combined to generate the emitted light, wherein the first CCT is warmer than the second CCT and the first LED filament in each one of the pairs of LED filaments is disposed outside of the second LED filament in the each one of the pairs of LED filaments; and
a controller that changes the CCT of the emitted light when the lamp is dimmed.

20. A lamp comprising:
an optically transmissive enclosure for emitting an emitted light;
a base connected to the enclosure;
at least one first LED filament and at least one second LED filament in the enclosure operable to emit light when energized through an electrical path from the base, the at least one first LED filament emitting light having a first correlated color temperature (CCT) and the at least one second LED filament emitting light having a second CCT that are combined to generate the emitted light, wherein the at least one first LED filament comprises a plurality of first LEDs mounted on a front side of a first optically transmissive substrate and the at least one second LED filament comprises a plurality of second LEDs mounted on a first side of a second optically transmissive substrate wherein a backside of the first substrate includes a first reflector layer and a backside of the second substrate includes a second reflector layer; and a controller that changes the CCT of the emitted light when the lamp is dimmed.

21. A lamp comprising:

an optically transmissive enclosure for emitting an emitted light;

a base connected to the enclosure;

at least one first LED filament and at least one second LED filament in the enclosure operable to emit light when energized through an electrical path from the base, the at least one first LED filament emitting light at a first color point and the at least one second LED filament emitting light at a second color point where the at least one first LED filament and the at least one second LED filament are independently controlled to generate the emitted light with a controllable CCT and a controllable luminous flux, wherein the first color point is warmer than the second color point and the first LED filament in one of the groups of LED filaments is disposed outside of the second LED filament in the one of the groups of LED filaments; and a controller that changes the CCT of the emitted light when the luminous flux of the emitted light is changed.

* * * * *